(12) United States Patent
Kim et al.

(10) Patent No.: US 9,479,193 B2
(45) Date of Patent: Oct. 25, 2016

(54) APPARATUS AND METHOD FOR PERFORMING COMPRESSION OPERATION IN HASH ALGORITHM

(71) Applicant: ELECTRONICS AND TELECOMMUNICATIONS RESEARCH INSTITUTE, Daejeon (KR)

(72) Inventors: Dong-Chan Kim, Daejeon (KR); Deukjo Hong, Daejeon (KR); Jung Keun Lee, Daejeon (KR); Daesung Kwon, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 236 days.

(21) Appl. No.: 14/305,147

(22) Filed: Jun. 16, 2014

(65) Prior Publication Data

US 2015/0032704 A1 Jan. 29, 2015

(30) Foreign Application Priority Data

Jul. 26, 2013 (KR) ........................ 10-2013-0088514

(51) Int. Cl.
*G06F 7/00* (2006.01)
*H03M 7/30* (2006.01)

(52) U.S. Cl.
CPC .................................. *H03M 7/3059* (2013.01)

(58) Field of Classification Search
None
See application file for complete search history.

(56) References Cited

U.S. PATENT DOCUMENTS 5,897,662 A * 4/1999 Corrigan ............. G06F 12/1009
711/170

5,992,737 A * 11/1999 Kubota ............. G06F 17/30985
235/380

(Continued)

FOREIGN PATENT DOCUMENTS

EP 1 257 084 A1 11/2002
JP 2009-159618 A 7/2009

(Continued)

OTHER PUBLICATIONS

Deukjo Hong et al., "A New Dedicated 256-Bit Hash Function: FORK-256," FSE 2006, pp. 195-209, 2006.

*Primary Examiner* — Jay Morrison
*Assistant Examiner* — Hasanul Mobin
(74) *Attorney, Agent, or Firm* — LRK Patent Law Firm

(57) ABSTRACT

An apparatus and method for performing a compression operation in a hash algorithm are provided. The apparatus includes an interface unit, a message extension unit, a chain variable initial conversion unit, a compression function computation unit, and a chain variable final conversion unit. The interface unit receives a message and chain variable data. The message extension unit generates a plurality of extended messages from the message. The chain variable initial conversion unit converts the chain variable data into initial state data for a compression function. The compression function computation unit repeatedly computes extended message binding and step functions based on the initial state data and the plurality of extended messages, and performs combination with a final extended message, thereby computing final state data. The chain variable final conversion unit generates and outputs chain variable data, into which the chain variable data has been updated, using the final state data.

10 Claims, 4 Drawing Sheets

(56) References Cited

U.S. PATENT DOCUMENTS

| | | | |
|---|---|---|---|
| 6,258,167 B1* | 7/2001 | Kawano | B05B 15/02 118/302 |
| 7,181,009 B1* | 2/2007 | Huxel | H04L 9/0643 380/28 |
| 8,571,207 B2 | 10/2013 | Nishikawa et al. | |
| 8,787,563 B2 | 7/2014 | Shirai et al. | |
| 2003/0041242 A1* | 2/2003 | Patel | H04L 9/3242 713/170 |
| 2006/0034456 A1* | 2/2006 | McGough | H04L 9/0844 380/30 |
| 2009/0319547 A1* | 12/2009 | Hollis | G06F 17/30153 |
| 2010/0135484 A1* | 6/2010 | Nishikawa | H04L 9/3239 380/28 |
| 2011/0211688 A1 | 9/2011 | Shirai et al. | |
| 2011/0238636 A1 | 9/2011 | Shirai et al. | |
| 2012/0128151 A1* | 5/2012 | Boehm | H04L 65/602 380/42 |
| 2012/0257742 A1* | 10/2012 | Ebeid | H04L 9/0643 380/28 |
| 2013/0336480 A1* | 12/2013 | Hong | H04L 9/0618 380/44 |
| 2014/0355755 A1* | 12/2014 | Hong | H04L 9/0643 380/28 |

FOREIGN PATENT DOCUMENTS

| | | |
|---|---|---|
| JP | 2010-049126 A | 3/2010 |
| JP | 2010-049127 A | 3/2010 |
| JP | 2010-128392 A | 6/2010 |
| KR | 10-0916805 B1 | 9/2009 |

* cited by examiner

APPARATUS AND METHOD FOR PERFORMING COMPRESSION OPERATION IN HASH ALGORITHM

CROSS REFERENCE TO RELATED APPLICATION

This application claims the benefit of Korean Patent Application No. 10-2013-0088514, filed on Jul. 26, 2013, which is hereby incorporated by reference herein in its entirety.

BACKGROUND OF THE INVENTION

1. Technical Field

The present disclosure relates generally to an apparatus and method for performing a compression operation in a hash algorithm, and, more particularly, to an apparatus and method for performing a compression operation in a high-speed message hash algorithm, which receive a 1024-bit message and 512-bit chain variable data, or a 2048-bit message and 1024-bit chain variable data, repeatedly compute 256-bit register based extended message binding and step functions, and perform combination with a final extended message, thereby computing updated 512- or 1024-bit chain variable data that forms the basis of a hash value.

2. Description of the Related Art

The provision of the integrity of messages is the main functionality of encryption applications that are used for the communication and data storage of a variety of types of equipment. Hash functions are functions for guaranteeing the integrity of messages, and are widely used for the signatures and authentication of messages. Generally, in a hash function, chain variable data is used, a message is divided into message units of a specific length, and the message units are input to a compression function along with the chain variable data, thereby updating the chain variable data. Final chain variable data output from a compression function is processed by means of various algorithms and converted into a hash value of the corresponding message.

In this regard, Korean Patent No. 10-0916805 entitled "Hash Algorithm having 256-bit Output" discloses a hash algorithm technique that receives a message bit string of arbitrary length, converts the message bit string into a word string, converts an input message into preset bits, and then performs a compression operation, thereby computing chain variables.

In order to increase the speed efficiency of a hash function, a compression function, which is the core algorithm of the hash function, needs to be designed to be optimally implemented in a chip or a central processing unit (CPU) specialized for an encryption application.

SUMMARY OF THE INVENTION

Accordingly, at least one embodiment of the present invention is intended to provide a technique for computing a 256-bit register based compression function, which has a 512- or 1024-bit output value, guarantees security against existing attacks, and is applied to a hash function capable of high-speed message hashing.

In accordance with an aspect of the present invention, there is provided an apparatus for performing a compression operation in a hash algorithm, including an interface unit configured to receive a message and chain variable data from the outside; a message extension unit configured to generate a plurality of extended messages from the message; a chain variable initial conversion unit configured to convert the chain variable data into initial state data for a compression function; a compression function computation unit configured to repeatedly compute extended message binding and step functions based on the initial state data and the plurality of extended messages, and to perform combination with a final extended message, thereby computing final state data; and a chain variable final conversion unit configured to generate and output chain variable data, into which the chain variable data has been updated, using the final state data.

The message extension unit may receive a 1024- or 2048-bit message (M=M[0]||M[1]|| ... ||M[31]) in which 32 32- or 64-bit sub messages (M[0], M[1], ..., M[31]) are successively connected to each other, and may generate 27 512- or 1024-bit extended messages (W_r=W_r[0]||W_r[1]|| ... ||W_r[15], 0≤r≤26) in each of which 16 32- or 64-bit sub extended messages (W_r[0], W_r[1], ..., W_r[15]) are successively connected to each other, based on the following equation:

$$W\_0[i]=M[i],\ 0\le i\le 15;$$

$$W\_1[i-16]=M[i],\ 16\le i\le 31;$$

$$W\_r[i]=W\_(r-2)[\tau(i)] \boxplus W\_(r-1)[i],\ 2\le r\le 26, 0\le i\le 15;$$

$$\tau(0)=3, \tau(1)=2, \tau(2)=0, \tau(3)=1, \tau(4)=7, \tau(5)=4,$$

$$\tau(6)=5, \tau(7)=6, \tau(8)=11, \tau(9)=10, \tau(10)=8,$$

$$\tau(11)=9, \tau(12)=15, \tau(13)=12, \tau(14)=13, \tau(15)=14 \quad (3)$$

The chain variable initial conversion unit may receive 512- or 1024-bit chain variable data (CV=CV[0]||CV[1]|| ... ||CV[15]) in which 16 pieces of 32- or 64-bit sub chain variable data (CV[0], CV[1], ..., CV[15]) are successively connected to each other, and may convert the 512- or 1024-bit chain variable data (CV=CV[0]||CV[1]|| ... ||CV[15]) into 512- or 1024-bit initial state data (X_0=X_0[0]||X_0[1]|| ... ||X_0[15]) in which 16 pieces of 32- or 64-bit initial sub state data (X_0[0], X_0[i], X_0[15]) are successively connected to each other, based on an equation (X_0[i]=CV[i], 0≤i≤15).

The compression function computation unit may compute the final state data based on the 512- or 1024-bit initial state data (X_0=X_0[0]||X_0[1]|| ... ||X_0[15]) and the 27 512- or 1024-bit extended messages (W_r[0], W_r[1], ..., W_r[15]; 0≤r≤26), the compression function computation unit computing the final state data by repeatedly computing the following Equation 7, which is the extended message binding function, and the following Equation 8, which is the step function, and then computing the following Equation 9 that is combined with a final extended message:

$$X\_r[i]=X\_r[i]\oplus W\_r[i],\ 0\le i\le 15$$

$$X\_r[i]=X\_r[i] \boxplus X\_r[i+8],\ 0\le i\le 7;$$

$$X\_r[i]=ROTL(X\_r[i],a),\ 0\le i\le 7;$$

$$X\_r[i]=X\_r[i]\oplus C\_r[i],\ 0\le i\le 7;$$

$$X\_r[i]=X\_r[i-8] \boxplus X\_r[i],\ 8\le i\le 15;$$

$$X\_r[i]=ROTL(X\_r[i],b),\ 8\le i\le 15;$$

$$X\_r[i]=X\_r[i] \boxplus X\_r[i+8],\ 0\le i\le 7;$$

$$X\_r[9]=ROTL(X\_r[9],c);$$

$X\_r[10]=ROTL(X\_r[10],2c);$ $X\_r[11]=ROTL(X\_r[11],3c);$ $X\_r[13]=ROTL(X\_r[13],c);$ $X\_r[14]=ROTL(X\_r[14],2c);$ $X\_r[15]=ROTL(X\_r[15],3c);$ $X\_(r+1)[i]=X\_r[\sigma(i)],\ 0\leq i\leq 15;$ (7)

$\sigma(0)=6,\ \sigma(1)=4,\ \sigma(2)=5,\ \sigma(3)=7,\ \sigma(4)=12,\ \sigma(5)=15,$ $\sigma(6)=14,\ \sigma(7)=13,\ \sigma(8)=2,\ \sigma(9)=0,\ \sigma(10)=1,\ \sigma(11)=3,$ $\sigma(12)=8,\ \sigma(13)=11,\ \sigma(14)=10,\ \sigma(15)=9$ (8)

$X\_26[i]=X\_26[i]\oplus W\_26[i],\ 0\leq i\leq 15$ (9)

where $x \oplus y$ is an operation that outputs the logic exclusive sum (eXclusive-OR (XOR)) of 32- or 64-bit x and y, $x \boxplus y$ is an operation that outputs a remainder obtained by dividing a sum of values, in which 32- or 64-bit x and y are represented using positive integers, by 232 or 264 in a form of 32- or 64-bit output, ROTL (x, j) is an operation that cyclically shifts 32- or 64-bit x to a left by j bits and then outputs a resulting value, a is 5 and b is 23 when r is an even number and a is 25 and b is 19 when r is an odd number, c is 8 in a case of a 32 bit unit and 16 in a case of a 64 bit unit, and the 256- or 512-bit data $(C\_r=C\_r[0]\|C\_r[1]\|\ldots|C\_r[7]$ is a constant that is fixed and then used.

The step function computation unit may repeatedly compute the extended message binding function and the step function with respect to "r" ranging from 0 to 25 26 times and perform combination with a final extended message, thereby computing 512- or 1024-bit final state data $(X\_26=X\_26[0]\|X\_26[1]\|\ldots\|X\_26[15])$ in which 16 pieces of 32- or 64-bit final sub state data $(X\_26[0], X\_26[1], \ldots, X\_26[15])$ are successively connected to each other.

The chain variable final conversion unit may update the 512- or 1024-bit chain variable data $(CV=CV[0]\|CV[1]\|\ldots\|CV[15])$ based on an equation $(CV'[i]=X\_26[i],\ 0\leq i\leq 15)$, and may output the updated 512- or 1024-bit chain variable data $(CV'=CV'[0]\|CV'[1]\|\ldots\|CV'[15])$.

In accordance with another aspect of the present invention, there is provided a method of performing a compression operation in a hash algorithm, including receiving a message and chain variable data from the outside; generating a plurality of extended messages from the message; converting the chain variable data into initial state data for a compression function; repeatedly computing extended message binding and step functions based on the initial state data and the plurality of extended messages, and performing combination with a final extended message, thereby computing final state data; and generating and outputting chain variable data, into which the chain variable data has been updated, using the final state data.

Generating the plurality of extended messages may include receiving a 1024- or 2048-bit message $(M=M[0]\|M[1]\|\ldots\|M[31])$ in which 32 32- or 64-bit sub messages $(M[0], M[1], \ldots, M[31])$ are successively connected to each other, and generating 27 512- or 1024-bit extended messages $(W\_r=W\_r[0]\|W\_r[1]\|\ldots\|W\_r[15],\ 0\leq r\leq 26)$ in each of which 16 32- or 64-bit sub extended messages $(W\_r[0], W\_r[1], \ldots, W\_r[15])$ are successively connected to each other, based on the following equation:

$W\_0[i]=M[i],\ 0\leq i\leq 15;$ $W\_1[i-16]=M[i],\ 16\leq i\leq 31;$ $W\_r[i]=W\_(r-2)[\tau(i)] \boxplus W\_(r-1)[i],\ 2\leq r\leq 26,\ 0\leq i\leq 15;$ $\tau(0)=3,\ \tau(1)=2,\ \tau(2)=0,\ \tau(3)=1,\ \tau(4)=7,\ \tau(5)=4,$ $\tau(6)=5,\ \tau(7)=6,\ \tau(8)=11,\ \tau(9)=10,\ \tau(10)=8,$ $\tau(11)=9,\ \tau(12)=15,\ \tau(13)=12,\ \tau(14)=13,\ \tau(15)\ 14$ (3)

Converting the chain variable data into the initial state data for the compression function may include receiving 512- or 1024-bit chain variable data $(CV=CV[0]\|CV[1]\|\ldots\|CV[15])$ in which 16 pieces of 32- or 64-bit sub chain variable data $(CV[0], CV[1], \ldots, CV[15])$ are successively connected to each other, and converting the 512- or 1024-bit chain variable data $(CV=CV[0]\|CV[1]\|\ldots\|CV[15])$ into 512- or 1024-bit initial state data $(X\_0=X\_0[0]\|X\_0[1]\|\ldots\|X\_0[15])$ in which 16 pieces of 32- or 64-bit initial sub state data $(X\_0[0], X\_0[1], \ldots, X\_0[15])$ are successively connected to each other, based on an equation $(X\_0[i]=CV[i],\ 0\leq i\leq 15)$.

Repeatedly computing extended message binding and step functions and performing combination may include computing the final state data based on the 512- or 1024-bit initial state data $(X\_0=X\_0[0]\|X\_0[1]\|\ldots\|X\_0[15])$ and the 27 512- or 1024-bit extended messages $(W\_r[0], W\_r[1], \ldots, W\_r[15];\ 0\leq r\leq 26)$, the final state data being computed by repeatedly computing the following Equation 7, which is the extended message binding function, and the following Equation 8, which is the step function, and then computing the following Equation 9 that is combined with a final extended message:

$X\_r[i]=X\_r[i]\oplus W\_r[i],\ 0\leq i\leq 15$ $X\_r[i]=X\_r[i] \boxplus X\_r[i+8],\ 0\leq i\leq 7;$ $X\_r[i]=ROTL(X\_r[i],a),\ 0\leq i\leq 7;$ $X\_r[i]=X\_r[i]\oplus C\_r[i],\ 0\leq i\leq 7;$ $X\_r[i]=X\_r[i-8] \boxplus X\_r[i],\ 8\leq i\leq 15;$ $X\_r[i]=ROTL(X\_r[i],b),\ 8\leq i\leq 15;$ $X\_r[i]=X\_r[i] \boxplus X\_r[i+8],\ 0\leq i\leq 7;$ $X\_r[9]=ROTL(X\_r[9],c);$ $X\_r[10]=ROTL(X\_r[10],2c);$ $X\_r[11]=ROTL(X\_r[11],3c);$ $X\_r[13]=ROTL(X\_r[13],c);$ $X\_r[14]=ROTL(X\_r[14],2c);$ $X\_r[15]=ROTL(X\_r[15],3c);$ $X\_(r+1)[i]=X\_r[\sigma(i)],\ 0\leq i\leq 15;$ (7)

$\sigma(0)=6,\ \sigma(1)=4,\ \sigma(2)=5,\ \sigma(3)=7,\ \sigma(4)=12,\ \sigma(5)=15,$ $\sigma(6)=14,\ \sigma(7)=13,\ \sigma(8)=2,\ \sigma(9)=0,\ \sigma(10)=1,\ \sigma(11)=3,$ $\sigma(12)=8,\ \sigma(13)=11,\ \sigma(14)\ 10,\ \sigma(15)=9$ (8)

$X\_26[i]=X\_26[i]\oplus W\_26[i],\ 0\leq i\leq 15$ (9)

where $x \oplus y$ is an operation that outputs the logic exclusive sum (eXclusive-OR (XOR)) of 32- or 64-bit x and y, $x \boxplus y$ is an operation that outputs a remainder obtained by dividing a sum of values, in which 32- or 64-bit x and y are represented using positive integers, by 232 or 264 in a form of 32- or 64-bit output, ROTL (x, j) is an operation that cyclically shifts 32- or 64-bit x to a left by j bits and then outputs a resulting value, a is 5 and b is 23 when r is an even number and a is 25 and b is 19 when r is an odd number, c is 8 in a case of a 32 bit unit and 16 in a case of a 64 bit unit, and the 256- or 512-bit data (C_r=C_r[0]||C_r[1]|| . . . |C_r[7] is a constant that is fixed and then used.

Computing the final state data by repeatedly computing the step function may include repeatedly computing the extended message binding function and the step function with respect to "r" ranging from 0 to 25 26 times and performing combination with a final extended message, thereby computing 512- or 1024-bit final state data (X_26=X_26[0]||X_26[1]|| . . . ||X_26[15]) in which 16 pieces of 32- or 64-bit final sub state data (X_26[0], X_26[1], . . . , X_26[15]) are successively connected to each other.

Generating and outputting the chain variable data into which the chain variable data has been updated may include updating the 512- or 1024-bit chain variable data (CV=CV[0]||CV[1]|| . . . ||CV[15]) based on an equation (CV'[i]=X_26[i], 0≤i≤15), and outputting the updated 512- or 1024-bit chain variable data (CV'=CV'[0]||CV'[1]|| . . . ||CV'[15]).

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
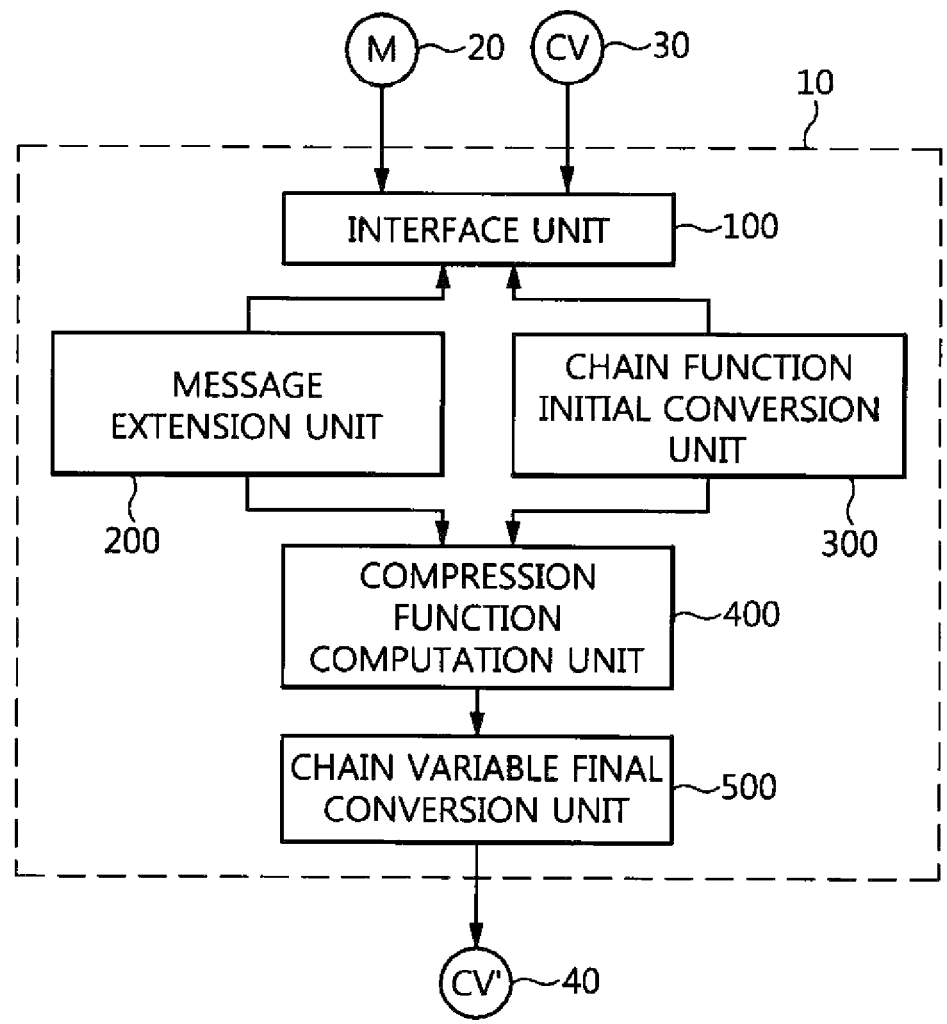
FIG. 1 is a block diagram of the configuration of an apparatus for performing a compression operation in a hash algorithm according to an embodiment of the present invention.

The present invention is described in detail below with reference to the accompanying drawings. Repeated descriptions and descriptions of known functions and configurations which have been deemed to make the gist of the present invention unnecessarily obscure will be omitted below. The embodiments of the present invention are intended to fully describe the present invention to a person having ordinary knowledge in the art to which the present invention pertains. Accordingly, the shapes, sizes, etc. of components in the drawings may be exaggerated to make the description clear.

The configuration and operation of an apparatus for performing a compression operation in a hash algorithm according to the present invention are described with reference to FIGS. 1 and 2.

FIG. 1 is a block diagram of the configuration of an apparatus 10 for performing a compression operation in a hash algorithm according to an embodiment of the present invention.

Referring to FIG. 1, the apparatus 10 for performing a compression operation in a hash algorithm according to this embodiment of the present invention includes an interface unit 100 configured to receive a message M 20 and chain variable data CV 30 from the outside; a message extension unit 200 configured to generate a plurality of extended messages from the message M 20; a chain variable initial conversion unit 300 configured to convert the chain variable data CV 30 into initial state data for a compression function; a compression function computation unit 400 configured to repeatedly compute an extended message binding function for updating chain variable data through the combination of a plurality of extended messages, generated by the message extension unit 200, with the chain variable data CV 30 and a step function for directly updating the chain variable data CV 30, and to then combine the chain variable data CV 30 with a final extended message, thereby computing final state data; and a chain variable final conversion unit 500 configured to generate and output updated chain variable data CV' 40, into which the chain variable data CV 30 input to the interface unit 100 has been updated, using the computed final state computed by the data compression function computation unit 400.

The interface unit 100 receives a 1024- or 2048-bit message M 20 from a user as a compression and encryption target message. Furthermore, the interface unit 100 receives 512- or 1024-bit chain variable data CV 30 from a chain variable generation means (not illustrated) located outside the apparatus 10 for performing a compression operation in a hash algorithm according to an embodiment of the present invention. In this case, the interface unit 100 transfers the received message M 20 to the message extension unit 200, and transfers the chain variable data CV 30 to the chain variable initial conversion unit 300.

The message extension unit 200 generates 27 512- or 1024-bit extended messages (W_0, W_1, . . . , W_26: W_r, 0≤r≤26) from the 1024- or 2048-bit message M received from the interface unit 100. In this case, the 1024- or 2048-bit message M input to the message extension unit 200 is formed such that 32 32- or 64-bit sub messages (M[0], M[1], . . . , M[31]) are successively connected to each other, as expressed by the following Equation 1:

$$M=M[0]||m[1]||M[31] \quad (1)$$

The message extension unit 200 generates 27 512- or 1024-bit extended messages (W_r, 0≤r≤26) in each of which 16 32- or 64-bit sub extended messages (W_r[0], W_r[1], . . . , W_r[15]) are successively connected to each other, as expressed by the following Equation 2, from the input 1024- or 2048-bit message (M=M[0]||M[1]|| . . . ||M[31]):

$$W\_r=W\_r[0], W\_r[1], \ldots, W\_r[15], 0 \leq r \leq 26 \quad (2)$$

In this case, the message extension unit 200 generates a total of 27 512- or 1024-bit extended messages (W_0, W_1, . . . , W_26; W_r=W_r[0]||W_r[1]|| . . . ||W_r[15], 0≤r≤26) from the 1024- or 2048-bit message (M=M[0]||M[1]|| . . . ||M[31]) based on the following Equation 3:

$$W\_0[i]=M[i], 0 \leq i \leq 15;$$

$$W\_1[i-16]=M[i], 16 \leq i \leq 31;$$

$$W\_r[i]=W\_(r-2)[\tau(i)] \boxplus W\_(r-1)[i], 2 \leq r \leq 26, 0 \leq i \leq 15;$$

$$\tau(0)=3, \tau(1)=2, \tau(2)=0, \tau(3)=1, \tau(4)=7, \tau(5)=4,$$

$$\tau(6)=5, \tau(7)=6, \tau(8)=11, \tau(9)=10, \tau(10)=8,$$

$$\tau(11)=, 9, \tau(12)=15, \tau(13)=12, \tau(14)=13, \tau(15)=14 \quad (3)$$

Furthermore, the message extension unit 200 outputs 27 512- or 1024-bit extended messages (W_0, W_1, ..., W_26; W_r=W_r[0]||W_r[1]|| ... ||W_r[15], 0≤r≤26) generated from the 1024- or 2048-bit message (M=M[0], M[1], ..., M[31]) to the compression function computation unit 400.

The chain variable initial conversion unit 300 converts the 512- or 1024-bit chain variable data CV received from the interface unit 100 into 512- or 1024-bit initial state data X_0. In this case, the 512- or 1024-bit chain variable data CV input to the chain variable initial conversion unit 300 is formed in such a way that 16 pieces of 32- or 64-bit sub chain variable data (CV[0], CV[1], ..., CV[15]) are successively connected to each other, as expressed by the following Equation 4:

$$CV=CV[0]||CV[1]|| \ldots ||CV[15] \quad (4)$$

The chain variable initial conversion unit 300 converts the input 512- or 1024-bit chain variable data (CV=CV[0]||CV[1]|| ... ||CV[15]) into 512- or 1024-bit initial state data (X_0=X_0[0]||X_0[1]|| ... ||X_0[15]) formed in such a manner that 16 pieces of 32- or 64-bit initial sub state data (X_0[0], X_0[1], ..., X_0[15]) are successively connected to each other, as expressed by the following Equation 5:

$$X\_0=X\_0[0]||X\_0[1]|| \ldots ||X\_0[15] \quad (5)$$

In this case, the chain variable initial conversion unit 300 converts the 512- or 1024-bit chain variable data (CV=CV[0]||CV[1]|| ... ||CV[15]) into 512- or 1024-bit initial state data (X_0=X_0[0]||X_0[1]|| ... ||X_0[15]) based on the following Equation 6:

$$X\_0[i]=CV[i], \quad 0 \leq i \leq 15 \quad (6)$$

The chain variable initial conversion unit 300 outputs the 512- or 1024-bit initial state data (X_0=X_0[0]||X_0[1]|| ... ||X_0[15]), into which the input 512- or 1024-bit chain variable data (CV=CV[0]||CV[1]|| ... ||CV[15]) has been converted, to the compression function computation unit 400.

The compression function computation unit 400 calculates a final state data by sequentially and repeatedly computing the following Equation 7, that is, an extended message binding function, and the following Equation 8, that is, a step function, using 512- or 1024-bit initial state data (X_0=X_0[0]||X_1[1]|| ... ||X_0[15]) received from the chain variable initial conversion unit 300 as an initial value and also using the 27 512- or 1024-bit extended messages (W_0, W_1, ..., W_26; W_r=W_r[0]||W_r[1]|| ... ||W_r[15], 0≤r26) received from message extension unit 200 and then computing Equation 9:

$$X\_r[i]=X\_r[i] \oplus W\_r[i], \quad 0 \leq i \leq 15$$

$$X\_r[i]=X\_r[i] \boxplus X\_r[i+8], \quad 0 \leq i \leq 7;$$

$$X\_r[i]=ROTL(X\_r[i],a), \quad 0 \leq i \leq 7;$$

$$X\_r[i]=X\_r[i] \oplus C\_r[i], \quad 0 \leq i \leq 7;$$

$$X\_r[i]=X\_r[i-8] \boxplus X\_r[i], \quad 8 \leq i \leq 15;$$

$$X\_r[i]=ROTL(X\_r[i],b), \quad 8 \leq i \leq 15;$$

$$X\_r[i]=X\_r[i] \boxplus X\_r[i+8], \quad 0 \leq i \leq 7;$$

$$X\_r[9]=ROTL(X\_r[9],c);$$

$$X\_r[10]=ROTL(X\_r[10],2c);$$

$$X\_r[11]=ROTL(X\_r[11],3c);$$

$$X\_r[13]=ROTL(X\_r[13],c);$$

$$X\_r[14]=ROTL(X\_r[14],2c);$$

$$X\_r[15]=ROTL(X\_r[15],3c);$$

$$X\_(r+1)[i]=X\_r[\sigma(i)], \quad 0 \leq i \leq 15 \quad (7)$$

$$\sigma(0)=6, \sigma(1)=4, \sigma(2)=5, \sigma(3)=7, \sigma(4)=12, \sigma(5)=15,$$

$$\sigma(6)=14, \sigma(7)=13, \sigma(8)=2, \sigma(9)=0, \sigma(10)=1, \sigma(11)=3,$$

$$\sigma(12)=8, \sigma(13)=11, \sigma(14)=10, \sigma(15)=9 \quad (8)$$

In this case, a is 5 and b is 23 when r is an even number, and a is 25 and b is 19 when r is an odd number. c is 8 in the case of a 32 bit unit, and 16 in the case of a 64 bit unit. Furthermore, the 256- or 512-bit data (C_r=C_r[0]||C_r[1]|| ... |C_r[7] is a constant that is fixed and then used.

$$X\_26[i]=X\_26[i] \oplus W\_26[i], \quad 0 \leq i \leq 15 \quad (9)$$

In this case, x⊕y is an operation that outputs the logic exclusive sum (eXclusive-OR (XOR)) of 32- or 64-bit x and y, x⊞y is an operation that outputs the remainder obtained by dividing the sum of values, in which 32- or 64-bit x and y are represented using positive integers, by $2^{32}$ or $2^{64}$ in the form of 32- or 64-bit output, and ROTL (x, j) is an operation that cyclically shifts 32- or 64-bit x to the left by j bits and then outputs a resulting value.

The compression function computation unit 400 sequentially and repeatedly computes Equations 7 and 8 26 times, and then computes Equation 9. The compression function computation unit 400 calculates final state data X_26 by successively connecting resulting values (X_26[0], X_26[1], ..., X_26[15]) obtained by computing the compression function, as expressed by the following Equation 10. The compression function computation unit 400 outputs the final state data X_26 to the chain variable final conversion unit 500.

$$X\_26=X\_26[0]||X\_26[1]|| \ldots ||X\_28[15] \quad (10)$$

Figure 2:
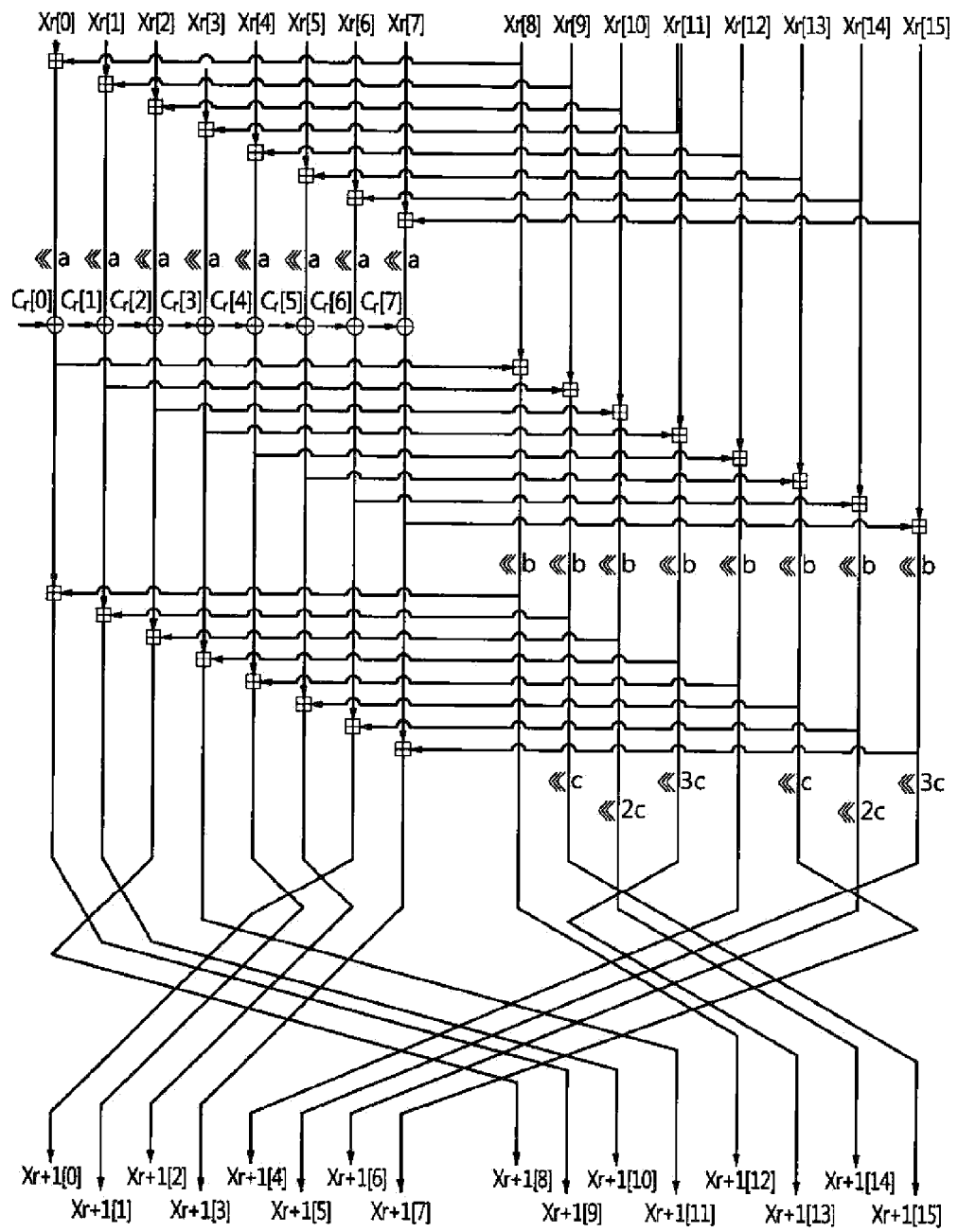
FIG. 2 is a diagram schematically illustrating the operations that are performed by the extended message binding and step function computation unit illustrated in FIG. 1.

Meanwhile, an operation in which the compression function computation unit 400 computes an extended message binding function and a step function using the sub state data (X_r[0], X_r[1], ..., X_r[15]) and the sub extended messages (W_r[0], W_r[1], ..., W_r[15]; 0≤r≤26) as input values, thereby obtaining sub state data (X_(r+1)[0], X_(r+1)[1], ..., X_(r+1)[15]), may be expressed, as illustrated in FIG. 2.

The chain variable final conversion unit 500 updates the chain variable data (CV=CV[0]||CV[1]|| ... ||CV[15]) input to the interface unit 100 using the final state data (X_26=X_26[0]||X_26[1]|| ... ||X_26[15]) received from the compression function computation unit 400, and outputs the updated chain variable data (CV'=CV'[0]||CV'[1]|| ... ||CV'[15]). In this case, the chain variable final conversion unit 500 generates the chain variable data (CV'=CV'[0]||CV'[1]|| ... ||CV'[15]) into which the 512-bit chain variable data CV=CV[0]||CV[1]|| ... ||CV[15] has been updated based on the following Equation 11:

$$CV'[i]=X\_26[i], \quad 0 \leq i \leq 15 \quad (11)$$

The updated 512- or 1024-bit chain variable data (CV'=CV'[0]||CV'[1]|| ... ||CV'[15]) output from the chain variable final conversion unit 500 is processed using well-known various algorithms, and is used as a hash value for the 1024- or 2048-bit message (M=M[0]||M[1]|| ... ||M[31]) input to the interface unit 100.

A method of performing a compression operation, which is performed by the apparatus for performing a compression operation in a hash algorithm according to the present invention, is described with reference to FIGS. 3 and 4. Descriptions identical to those of the apparatus 10 for performing a compression operation in a hash algorithm according to an embodiment of the present invention given in conjunction with FIGS. 1 and 2 are omitted.

Figure 3:
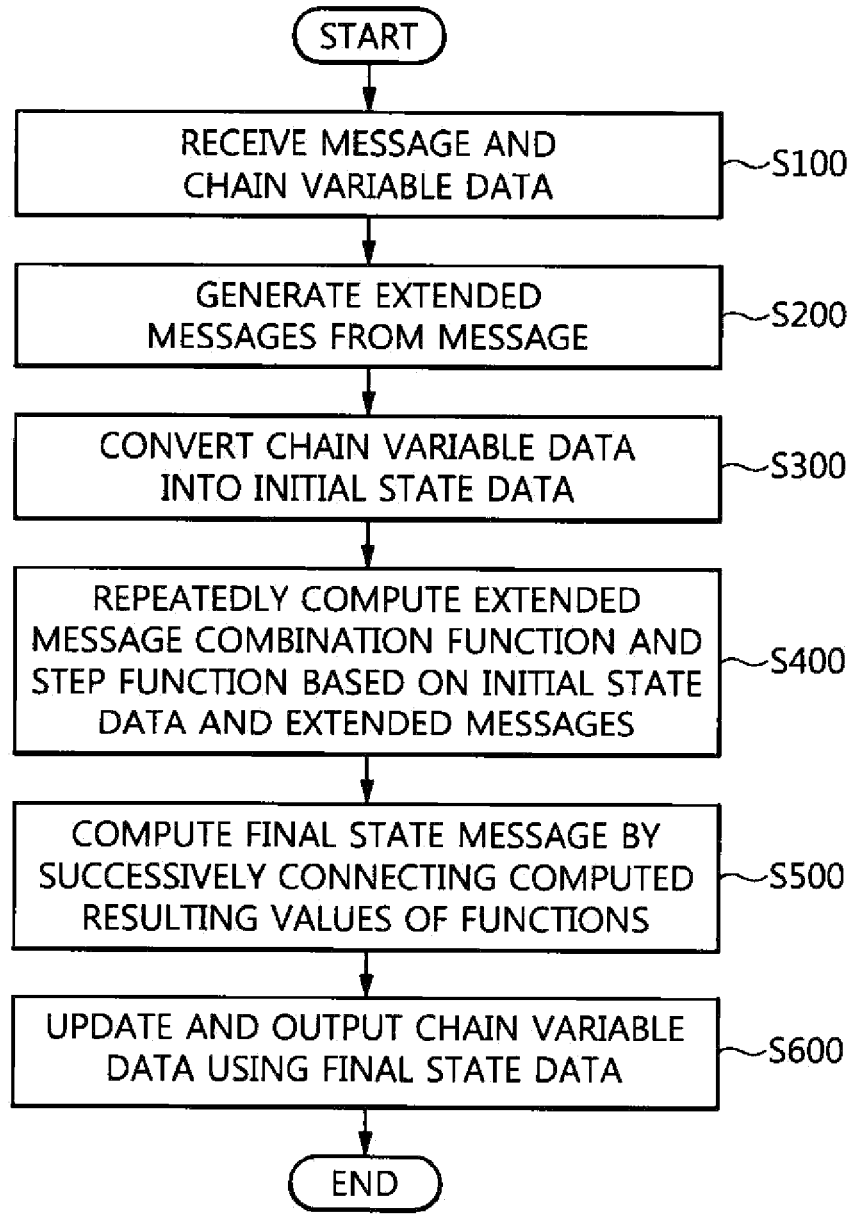
FIG. 3 is a flowchart of a method of performing a compression operation in a hash algorithm according to an embodiment of the present invention.

FIG. 3 is a flowchart of a method of performing a compression operation in a hash algorithm according to an embodiment of the present invention.

Referring to FIG. 3, in the method of performing a compression operation according to this embodiment of the present invention, first, the interface unit 100 receives a 1024- or 2048-bit message (M=M[0]||M[1]|| ... ||M[31]) and 512-bit chain variable data (CV=CV[0]||CV[1]|| ... ||CV[15]) from the outside at step S100. In this case, the interface unit 100 transfers the input 512-bit message (M=M[0]||M[1]|| ... ||M[31]) to the message extension unit 200, and transfers the 512- or 1024-bit chain variable data (CV=CV[0]||CV[1]|| ... ||CV[15]) to the chain variable initial conversion unit 300.

Furthermore, the message extension unit 200 generates 27 512- or 1024-bit extended messages (W_0, W_1, ..., W_26; W_r=W_r[0]||W_r[1]|| ... ||W_r[15], 0≤r≤26) in each of which 16 32- or 64-bit sub extended messages (W_r[0], W_r[1], ..., W_r[15]) are successively connected from the 1024- or 2048-bit message (M=M[0]||M[1]|| ... ||M[31]) in which 32 32- or 64-bit sub messages (M[0], M[1], ..., M[31]) are successively connected based on Equation 3 at step S200. In this case, the message extension unit 200 outputs the generated 27 512- or 1024-bit extended messages (W_r, 0≤r≤26) to the compression function computation unit 400.

Meanwhile, the chain variable initial conversion unit 300 converts the 512- or 1024-bit chain variable data (CV=CV[0]||CV[1]|| ... ||CV[15]) in which 16 pieces of 32- or 64-bit sub chain variable data (CV[0], CV[1], ..., CV[15]) are successively connected, received from the interface unit 100, into 512- or 1024-bit initial state data (X_0=X_0[0]||X_0[1]|| ... ||X_0[15]) in which 16 pieces of 32-bit initial sub state data (X_0[0], X_0[1], ..., X_0[15]) are successively connected, based on Equation 6 at step S300. In this case, the chain variable initial conversion unit 300 outputs the obtained 512- or 1024-bit initial state data (X_0=X_0[0]||X_0[1]|| ... ||X_0[15]) to the compression function computation unit 400.

Thereafter, the compression function computation unit 400 sequentially and repeatedly performs the operations of Equations 7 and 8 based on the 27 512- or 1024-bit extended messages (W_r, 0≤r≤26) received from the message extension unit 200 and the 512- or 1024-bit initial state data (X_0=X_0[0]||X_0[1]|| ... ||X_0[15]) received from the chain variable initial conversion unit 300, and finally computes a compression function for performing the operation of Equation 9 at step S400. In this case, the compression function computation unit 400 uses 16 pieces of 32- or 64-bit initial sub state data (X_0[0], X_0[1], ..., X_0[15]) as the input value of a first compression function, and performs the operation of an (r+1)-th step function by applying 16 32- or 64-bit sub extended messages (W_r[0], W_r[1], ..., W_r[15]).

Furthermore, the compression function computation unit 400 calculates 512-bit final state data (X_26=X_26[0]||X_26[1]|| ... ||X_26[15]) by successively connecting finally computed resulting values (i.e., X_26[0], X_26[1], ..., X_26[15]) at step S500. In this case, the compression function computation unit 400 outputs the computed 512- or 1024-bit final state data (X_26=X_26[0]||X_26[1]|| ... ||X_26[15]) to the chain variable final conversion unit 500.

Finally, the chain variable final conversion unit 500 updates the 512- or 1024-bit chain variable data (CV=CV[0]||CV[1]|| ... ||CV[15]) input to the interface unit 100 using the 512- or 1024-bit final state data (X_26=X_26[0]||X_26[1]|| ... ||X_26[15]) received from the compression function computation unit 400 and then outputs the updated date at step S600. In this case, the chain variable final conversion unit 500 updates the 512-bit chain variable data (CV=CV[0]||CV[1]|| ... ||CV[15]) input to the interface unit 100 based on Equation 11, and generates and outputs the updated 512- or 1024-bit chain variable data (CV'=CV'[0]||CV'[1]|| ... ||CV'[15]).

Figure 4:
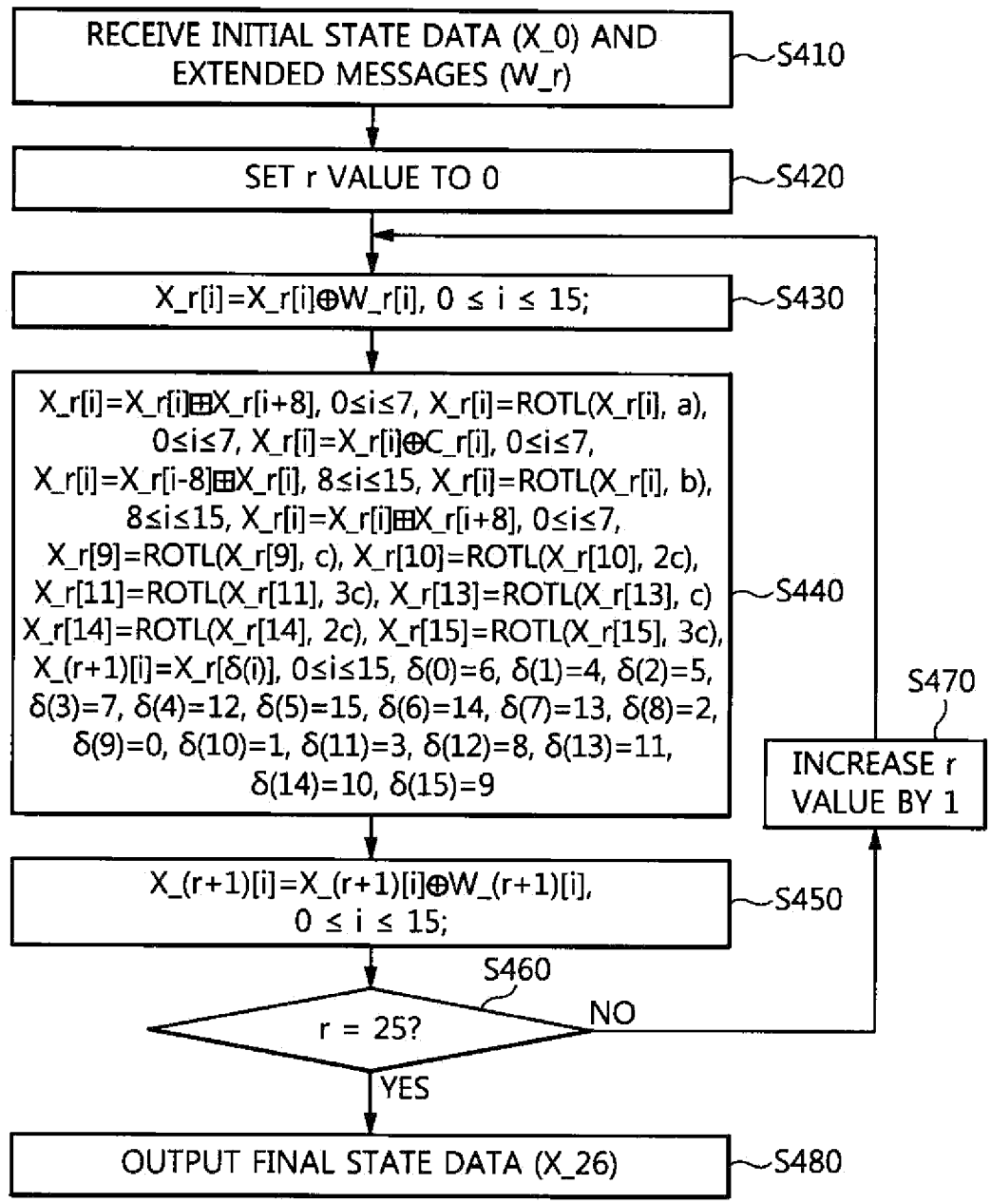
FIG. 4 is a detailed flowchart illustrating the step of repeatedly computing an extended message binding function and a step function in the method of performing a compression operation in a hash algorithm according to the present invention, which is illustrated in FIG. 3.

FIG. 4 is a detailed flowchart illustrating step S400 of repeatedly computing an extended message binding function and a step function in the method of performing a compression operation in a hash algorithm according to the present invention, which is illustrated in FIG. 3.

Referring to FIG. 4, at step S400 of repeatedly computing an extended message binding function and a step function, the step function computation unit 400 receives 27 512- or 1024-bit extended messages (W_r, 0≤r≤26) from the message extension unit 200, and receives 512- or 1024-bit initial state data (X_0=X_0[0]||X_0[1]|| ... ||X_0[15]) from the chain variable initial conversion unit 300 at step S410.

Thereafter, the step function computation unit 400 sets the "r" value to 0, and starts the first computation of an extended message binding function and a step function by using initial sub state data (X_0[0], X_0[1], ..., X_0[15]) as input values at step S420.

Furthermore, in (r+1)-th computation, the compression function computation unit 400 computes Equation 7 first at step S430, and then computes Equation 8 at step S440. Furthermore, at step S450, the compression function computation unit 400 finally computes the resulting values (X_(r+1)[0], X_(r+1)[1], ..., X_(r+1)[15]) of a (r+1)-th step function by using the value computed at step S440.

Thereafter, after the computation of the (r+1)-th step function has been performed at steps S430 to S450, the step function computation unit 400 determines whether the "r" value is 25 at step S460.

If, as a result of the determination at step S460, the "r" value is not 25 (i.e., the "r" value is smaller than 25), the compression function computation unit 400 increases the "r" value by 1 at step S470, and repeatedly computes the functions of steps S430 to S450.

In contrast, if, as a result of the determination at step S460, the "r" value is 25, the compression function computation unit 400 finally performs Equation 9 on resulting values (X_25[0], X_25[1], ..., X_25[15]) output in the computation of a 26th step function and outputs 512- or 1024-bit final state data (X_26=X_26[0]||X_26[1]|| ... ||X_26[15]) to the chain variable final conversion unit 500 at step S480.

Meanwhile, the method of performing a compression operation in a hash algorithm according to the present invention may be implemented in the form of program instructions that can be executed by various computer means, and may be recorded on a computer-readable recording medium. The computer-readable recording medium may restore program instructions, data files, and data structures solely or in combination. The program instructions recorded on the recording medium may have been specially designed and configured for the present invention, or may be known to or available to those who have ordinary knowledge in the field of computer software. Examples of the computer-readable recording medium include all types of hardware devices specially configured to record and execute program instructions, such as magnetic media, such as a hard disk, a floppy disk, and magnetic tape, optical media, such as CD-ROM and a DVD, magneto-optical media, such as a floptical disk, ROM, RAM, and flash memory. Examples of the program instructions include machine code, such as code created by a compiler, and high-level language code executable by a computer using an interpreter.

The apparatus and method for performing a compression operation in a hash algorithm according to the present invention have the advantages of providing not only a simple message extension algorithm but also a compression operation algorithm configured by combining only bit addition, bit rotation, bit eXclusive-OR (XOR) operators generally used in most central processing units (CPUs), thereby enabling high-speed parallel processing using a 256-bit register and accordingly enabling a CPU to perform a compression operation with small computational load.

Although the preferred embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. An apparatus for performing a compression operation in a hash algorithm, comprising:
   one or more central processing units (CPUs) and one or more memory containing instructions to perform the following:
   receiving a message including 1024- or 2048-bit message (M=M[0]∥M[1]∥ . . . ∥M[31]) in which 32 32- or 64-bit sub messages (M[0], M[1], . . . , M[31]) are successively connected to each other, and chain variable data including 512- or 1024-bit chain variable data from an outside;
   receiving the message and generating 27 512- or 1024-bit extended messages (W_r=r[0]∥W_r[1]∥ . . . ∥W_r[15], 0≤r≤26) in each of which 16 32- or 64-bit sub extended messages (W_r[0], W_r[1], . . . , W_r[15]) are successively connected to each other from the message;
   converting the chain variable data into initial state data for a compression function;
   repeatedly computing extended message binding and step functions based on the initial state data and the plurality of extended messages, and performing combination with a final extended message, thereby computing final state data; and
   generating and outputting chain variable data, into which the chain variable data has been updated, using the final state data,
   wherein generating the extended messages based on the following equation:

$W\_0[i]=M[i]$, $0 \le i \le 15$;

$W\_1[i-16]=M[i]$, $16 \le i \le 31$;

$W\_r[i]=W\_(r-2)[\tau(i)] \boxplus W\_(r-1)[i]$, $2 \le r \le 26$, $0 \le i \le 15$;

$\tau(0)=3, \tau(1)=2, \tau(2)=0, \tau(3)=1, \tau(4)=7, \tau(5)=4$, $\tau(6)=5, \tau(7)=6, \tau(8)=11, \tau(9)=10, \tau(10)=8$, $\tau(11)=9, \tau(12)=15, \tau(13)=12, \tau(14)=13, \tau(15)=14$.

2. The apparatus of claim 1, wherein the one or more central processing units (CPUs) receive 512- or 1024-bit chain variable data (CV=CV[0]∥CV[1]∥ . . . ∥CV[15]) in which 16 pieces of 32- or 64-bit sub chain variable data (CV[0], CV[1], . . . , CV[15]) are successively connected to each other, and convert the 512- or 1024-bit chain variable data (CV=CV[0]∥CV[1]∥ . . . ∥CV[15]) into 512- or 1024-bit initial state data (X_0=X_0[0]∥X_0[1]∥ . . . ∥X_0[15]) in which 16 pieces of 32- or 64-bit initial sub state data (X_0[0], X_0[1], . . . , X_0[15]) are successively connected to each other, based on an equation (X_0[i]=CV[i], 0≤i≤15).

3. The apparatus of claim 2, wherein the one or more central processing units (CPUs) compute the final state data based on the 512- or 1024-bit initial state data (X_0=X_0[0]∥X_0[1]∥ . . . X_0[15]) and the 27 512- or 1024-bit extended messages (W_r[0], W_r[1], . . . , W_r[15]; 0≤r≤26), the one or more central processing units (CPUs) computing the final state data by repeatedly computing the following Equation 7, which is the extended message binding function, and the following Equation 8, which is the step function, and then computing the following Equation 9 that is combined with a final extended message:

$X\_r[i]=X\_r[i] \oplus W\_r[i]$, $0 \le i \le 15$ $X\_r[i]=X\_r[i] \boxplus X\_r[i+8]$, $0 \le i \le 7$;

$X\_r[i]=ROTL(X\_r[i],a)$, $0 \le i \le 7$;

$X\_r[i]=X\_r[i] \oplus C\_r[i]$, $0 \le i \le 7$;

$X\_r[i]=X\_r[i-8] \boxplus X\_r[i]$, $8 \le i \le 15$;

$X\_r[i]=ROTL(X\_r[i],b)$, $8 \le i \le 15$;

$X\_r[i]=X\_r[i] \boxplus X\_r[i+8]$, $0 \le i \le 7$ $X\_r[9]=ROTL(X\_r[9],c)$;

$X\_r[10]=ROTL(X\_r[10],2c)$;

$X\_r[11]=ROTL(X\_r[11],3c)$;

$X\_r[13]=ROTL(X\_r[13],c)$;

$X\_r[14]=ROTL(X\_r[14],2c)$;

$X\_r[15]=ROTL(X\_r[15],3c)$;

$X\_(r+1)[i]=X\_r[\sigma(i)]$, $0 \le i \le 15$;

$\sigma(0)=6, \sigma(1)=4, \sigma(2)=5, \sigma(3)=7, \sigma(4)=12, \sigma(5)=15$, $\sigma(6)=14, \sigma(7)=13, \sigma(8)=2, \sigma(9)=0, \sigma(10)=1, \sigma(11)=3$, $\sigma(12)=8, \sigma(13)=11, \sigma(14)=10, \sigma(15)=9$ $X\_26[i]=X\_26[i] \oplus W\_26[i]$, $0 \le i \le 15$ where x⊕y is an operation that outputs the logic exclusive sum (eXclusive-OR (XOR)) of 32- or 64-bit x and y, x ⊞ y is an operation that outputs a remainder obtained by dividing a sum of values, in which 32- or 64-bit x and y are represented using positive integers, by 232 or 264 in a form of 32- or 64-bit output, ROTL (x, j) is an operation that cyclically shifts 32- or 64-bit x to a left by j bits and then outputs a resulting value, a is 5 and b is 23 when r is an even number and a is 25 and b is 19 when r is an odd number, c is 8 in a case of a 32 bit unit and 16 in a case of a 64 bit unit, and the 256- or 512-bit data ($C\_r = C\_r[0] \| C\_r[1] \| \ldots | C\_r[7]$) is a constant that is fixed and then used.

4. The apparatus of claim 3, wherein the one or more central processing units (CPUs) repeatedly compute the extended message binding and the step function with respect to "r" ranging from 0 to 25 26 times and perform combination with a final extended message, thereby computing 512- or 1024-bit final state data ($X\_26 = X\_26[0] \| X\_26[1] \| \ldots \| X\_26[15]$)$_{in}$ which 16 pieces of 32- or 64-bit final sub state data ($X\_26[0], X\_26[1], \ldots, X\_26[15]$) are successively connected to each other.

5. The apparatus of claim 4, wherein the one or more central processing units (CPUs) update the 512- or 1024-bit chain variable data ($CV = CV[0] \| CV[1] \| \ldots \| CV[15]$) based on an equation ($CV'[i] = X\_26[i], 0 \le i \le 15$), and output the updated 512- or 1024-bit chain variable data ($CV' = CV'[0] \| CV'[1] \| \ldots \| CV'[15]$).

6. A method of performing a compression operation in a hash algorithm, comprising:

receiving a message including 1024- or 2048-bit message ($M = M[0] \| M[1] \| \ldots \| m[31]$) in which 32 32- or 64-bit sub messages ($M[0], M[1], \ldots, M[31]$) are successively connected to each other, and chain variable data including 512- or 1024-bit chain variable data from an outside;

generating 27 512- or 1024-bit extended messages ($W\_r = W\_r[0] \| W\_r[1] \| \ldots \| W\_r[15], 0 \le r \le 26$) in each of which 16 32- or 64-bit sub extended messages ($W\_r[0], W\_r[1], \ldots, W\_r[15]$) are successively connected to each other from the message;

converting the chain variable data into initial state data for a compression function;

repeatedly computing extended message binding and step functions based on the initial state data and the plurality of extended messages, and performing combination with a final extended message, thereby computing final state data; and generating and outputting chain variable data, into which the chain variable data has been updated, using the final state data, wherein generating the extended messages is based on the following equation:

$W\_0[i] = M[i], 0 \le i \le 15;$ $W\_1[i-16] = M[i], 16 \le i \le 31;$ $W\_r[i] = W\_(r-2)[\tau(i)] \boxplus W\_(r-1)[i], 2 \le r \le 26, 0 \le i \le 15;$ $\tau(0)=3, \tau(1)=2, \tau(2)=0, \tau(3)=1, \tau(4)=7, \tau(5)=4,$ $\tau(6)=5, \tau(7)=6, \tau(8)=11, \tau(9)=10, \tau(10)=8,$ $\tau(11)=9, \tau(12)=15, \tau(13)=12, \tau(14)=13, \tau(15)=14.$

7. The method of claim 6, wherein converting the chain variable data into the initial state data for the compression function comprises receiving 512- or 1024-bit chain variable data ($CV = CV[0] \| CV[1] \| \ldots \| CV[15]$) in which 16 pieces of 32- or 64-bit sub chain variable data ($CV[0], CV[1], \ldots, CV[15]$) are successively connected to each other, and converting the 512- or 1024-bit chain variable data ($CV = CV[0] \| CV[1] \| \ldots \| CV[15]$) into 512- or 1024-bit initial state data ($X\_0 = X\_0[0] \| X\_0[1] \| \ldots \| X\_0[15]$) in which 16 pieces of 32- or 64-bit initial sub state data ($X\_0[0], X\_0[1], \ldots, X\_0[15]$) are successively connected to each other, based on an equation ($X\_0[i] = CV[i], 0 \le i \le 15$).

8. The method of claim 7, wherein repeatedly computing extended message binding and step functions and performing combination comprises computing the final state data based on the 512- or 1024-bit initial state data ($X\_0 = X\_0[0] \| X\_0[1] \| \ldots \| X\_0[15]$) and the 27 512- or 1024-bit extended messages $W\_r[0], W\_r[1], \ldots W\_r[15]$; 026), the final state data being computed by repeatedly computing the following Equation 7, which is the extended message binding function, and the following Equation 8, which is the step function, and then computing the following Equation 9 that is combined with a final extended message:

$X\_r[i] = X\_r[i] \oplus W\_r[i], 0 \le i \le 15$ $X\_r[i] = X\_r[i] \boxplus X\_r[i+8], 0 \le i \le 7;$ $X\_r[i] = ROTL(X\_r[i], a), 0 \le i \le 7;$ $X\_r[i] = X\_r[i] \oplus C\_r[i], 0 \le i \le 7;$ $X\_r[i] = X\_r[i-8] \boxplus X\_r[i], 8 \le i \le 15;$ $X\_r[i] = ROTL(X\_r[i], b), 8 \le i \le 15;$ $X\_r[i] = X\_r[i] \boxplus X\_r[i+8], 0 \le i \le 7;$ $X\_r[9] = ROTL(X\_r[9], c);$ $X\_r[10] = ROTL(X\_r[10], 2c);$ $X\_r[11] = ROTL(X\_r[11], 3c);$ $X\_r[13] = ROTL(X\_r[13], c);$ $X\_r[14] = ROTL(X\_r[14], 2c);$ $X\_r[15] = ROTL(X\_R[15], 3c);$ $X\_(r+1)[i] = X\_r[\sigma(i)], 0 \le i \le 15$ $\sigma(0)=6, \sigma(1)=4, \sigma(2)=5, \sigma(3)=7, \sigma(4)=12, \sigma(5)=15,$ $\sigma(6)=14, \sigma(7)=13, \sigma(8)=2, \sigma(9)=0, \sigma(10)=1, \sigma(11)=3,$ $\sigma(12)=8, \sigma(13)=11, \sigma(14)=10, \sigma(15)=9$ $X\_26[i] = X\_26[i] \oplus W\_26[i], 0 \le i \le 15$ where $x \oplus y$ is an operation that outputs the logic exclusive sum (eXclusive-OR (XOR)) of 32- or 64-bit x and y, x y is an operation that outputs a remainder obtained by dividing a sum of values, in which 32- or 64-bit x and y are represented using positive integers, by 232 or 264 in a form of 32- or 64-bit output, ROTL (x, j) is an operation that cyclically shifts 32- or 64-bit x to a left by j bits and then outputs a resulting value, a is 5 and b is 23 when r is an even number and a is 25 and b is 19 when r is an odd number, c is 8 in a case of a 32 bit unit and 16 in a case of a 64 bit unit, and the 256- or 512-bit data ($C\_r = C\_r[0] \| C\_r[1] \| \ldots | C\_r[7]$) is a constant that is fixed and then used.

9. The method of claim 8, wherein computing the final state data by repeatedly computing the step function comprises repeatedly computing the extended message binding function and the step function with respect to "r" ranging from 0 to 25 26 times and performing combination with a final extended message, thereby computing 512- or 1024-bit final state data ($X\_26 = X\_26[0] \| X\_26[1] \| \ldots X\_26[15]$) in which 16 pieces of 32- or 64-bit final sub state data ($X\_26[0], X\_26[1], \ldots, X\_26[15]$) are successively connected to each other.

10. The method of claim 9, wherein generating and outputting the chain variable data into which the chain variable data has been updated comprises updating the 512- or 1024-bit chain variable data (CV=CV[0]∥CV[1]∥ . . . ∥CV[15]) based on an equation (CV'[i]=X_26[i], 0≤i≤15), and outputting the updated 512- or 1024-bit chain variable data (CV'=CV[0]∥CV[1]∥ . . . ∥CV[15]).

\* \* \* \* \*